(12) United States Patent
Tian

(10) Patent No.: US 11,765,875 B2
(45) Date of Patent: Sep. 19, 2023

(54) SHIELDING FILM HAVING MULTI-LAYERED METAL STRUCTURE

(71) Applicant: HAINING ZHUOTAI ELECTRONIC MATERIALS CO., LTD, Zhejiang (CN)

(72) Inventor: Haiyu Tian, Zhejiang (CN)

(73) Assignee: HAINING ZHUOTAI ELECTRONIC MATERIALS CO., LTD, Zhejiang (CN)

( * ) Notice: Subject to any disclaimer, the term of this patent is extended or adjusted under 35 U.S.C. 154(b) by 10 days.

(21) Appl. No.: 17/620,762

(22) PCT Filed: May 27, 2020

(86) PCT No.: PCT/CN2020/092540
§ 371 (c)(1),
(2) Date: Dec. 20, 2021

(87) PCT Pub. No.: WO2021/004177
PCT Pub. Date: Jan. 14, 2021

(65) Prior Publication Data
US 2022/0361384 A1  Nov. 10, 2022

(30) Foreign Application Priority Data
Jul. 5, 2019  (CN) .......................... 201910604181.1

(51) Int. Cl.
*H05K 9/00* (2006.01)
*C23C 14/14* (2006.01)
*C23C 14/24* (2006.01)

(52) U.S. Cl.
CPC ........... *H05K 9/0088* (2013.01); *C23C 14/14* (2013.01); *C23C 14/24* (2013.01)

(58) Field of Classification Search
CPC .................................................. H05K 9/0088
See application file for complete search history.

(56) References Cited

U.S. PATENT DOCUMENTS 11,013,156 B1\* 5/2021 Huang ........................ C09J 9/02
2015/0030878 A1\* 1/2015 Zhi ...................... H05K 9/0088
428/323

(Continued)

FOREIGN PATENT DOCUMENTS

CN  102510712 A  6/2012
CN  202354026 U  7/2012

(Continued)

OTHER PUBLICATIONS

International Search Report for PCT/CN2020/092540 dated Jun. 17, 2020, ISA/CN.

*Primary Examiner* — Hung V Ngo
(74) *Attorney, Agent, or Firm* — Yue (Robert) Xu; Apex Attorneys at Law, LLP

(57) ABSTRACT

A shielding film having a multi-layered metal structure is provided, including an insulating layer and a multi-layered metal compounded on the insulating layer, wherein the thickness of each layer of metal is 0.05-5 μm, the multi-layered metal has 2-10 layers, and a conductive bonding layer is disposed between the multi-layered metal. In the present application, the thickness of each layer of metal is controlled by providing a multi-layered metal, and a conductive bonding layer is bonded between the layers of metal such that the shielding film has good flexibility and shielding effect. Additionally, the conductive bonding layer is used so that the binding force between the layers of metal is good, and a high-frequency signal shielding performance of greater than 80 db@10 ghz is ensured so that the shielding film has good flexibility and meets flexibility requirements for flexible circuit boards while also having good high-temperature resistance.

8 Claims, 1 Drawing Sheet

(56) References Cited

U.S. PATENT DOCUMENTS

2020/0329592 A1\* 10/2020 Seo .......................... B32B 7/12
2021/0059042 A1\* 2/2021 Yamauchi ............ H05K 9/0088

FOREIGN PATENT DOCUMENTS

| | | |
|---|---|---|
| CN | 104853576 A | 8/2015 |
| CN | 106604623 A | 4/2017 |
| CN | 107227120 A | 10/2017 |
| CN | 107333461 A | 11/2017 |
| CN | 108235670 A | 6/2018 |
| CN | 108834388 A | 11/2018 |
| CN | 210130065 U | 3/2020 |
| CN | 111163623 A | 5/2020 |
| KR | 20130083144 A | 7/2013 |
| WO | 2007119513 A1 | 10/2007 |

\* cited by examiner

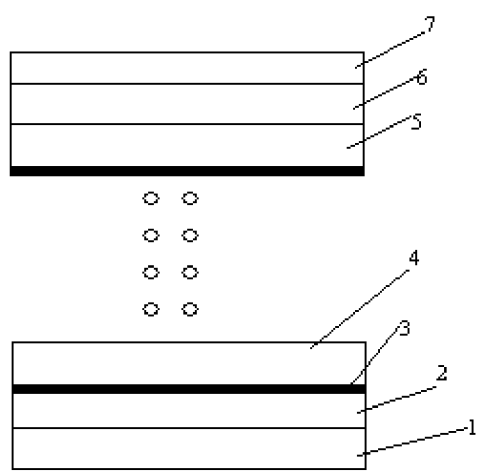

SHIELDING FILM HAVING MULTI-LAYERED METAL STRUCTURE

The present application is the national phase of International Application No. PCT/CN2020/092540, titled "SHIELDING FILM HAVING MULTI-LAYERED METAL STRUCTURE", filed on May 27, 2020, which claims the priority to Chinese Patent Application No. 201910604181.1, titled "SHIELDING FILM HAVING MULTI-LAYERED METAL STRUCTURE", filed with the China National Intellectual Property Administration on Jul. 5, 2019, the entire disclosures of which are incorporated herein by reference.

FIELD

The present application relates to the technical field of shielding films, and in particular to a shielding film having multi-layered metal structure.

BACKGROUND

The existing shielding film materials are copper foil or aluminum foil tapes and shielding film materials with the effectiveness of greater than 50 db within 1 GHz, which are preferred materials to many electronics factories due to low cost, easy accessibility, and good shielding effectiveness. However, when being specifically applied to the flexible circuit boards, the copper foil and aluminum foil cannot meet the performance requirements of thickness and bending resistance, and the ordinary shielding films cannot meet the shielding performance requirements of being greater than 65 db at the high frequencies above 1 GHz. There are shielding films for high-frequency application in the market by directly using the copper foil as the shielding layer, however, neither bending resistance nor high-temperature resistance of such shielding film can meet the manufacturing requirements to flexible boards. Moreover, it also substantially increases the production cost, and no value of use is provided.

SUMMARY

In view of this, an object of the present application is to provide a shielding film having a multi-layered metal structure, which has good flexibility and high shielding performance.

A shielding film having a multi-layered metal structure is provided according to the present application, including an insulating layer and multiple layers of metal composited on the insulating layer; the thickness of each layer of the multiple layers of metal is 0.05-5 μm and the number of layers of the multiple layers of metal is 2-10; and a conductive adhesive layer is arranged between the multiple layers of metal.

Preferably, the thickness of the insulating layer is 2 μm-20 μm.

Preferably, the thickness of the conductive adhesive layer is 1 μm-10 μm.

Preferably, a bending resistance of a whole body formed by the shielding film being composited to the flexible board is more than 20 times bending in a case of 135 degrees and Radius 0.38 mm under GB/T2679.5.

Preferably, each layer of the multiple layers of metal is independently selected to be nickel, gold, silver, copper, aluminum, or tin.

Preferably, the insulating layer comprises resin, an additive, a filler and a pigment with a mass ratio of 70-80:5-10:0-20:0-15; wherein the resin is selected to be one or more of polyurethane, epoxy, polyimide, modified silica gel and polyethylene terephthalate;

the additive is selected to be one or more of a curing agent, a dispersant agent and a modifying agent corresponding to the resin; and the filler is selected to be one or more of titanium dioxide, thermally conductive powder, silica and carbon powder.

Preferably, the conductive adhesive layer comprises an adhesive, metal powder, a curing agent and an additive with a mass ratio of 50-80:5-70:5-10:5-10.

Preferably, the thickness of the shielding film is 10 μm-50 μm.

Preferably, the multiple layers of metal are listed in sequence as follows:

silver having a thickness of 0.25-0.35 μm and nickel having a thickness of 0.25-0.35 μm; or, copper having a thickness of 0.45-0.55 μm, silver having a thickness of 0.2-0.25 μm, copper having a thickness of 0.95-1.05 μm, nickel having a thickness of 0.2-0.25 μm, and silver having a thickness of 0.2-0.25 μm; or, copper having a thickness of 0.95-1.05 μm, copper having a thickness of 0.55-0.55 μm, silver having a thickness of 0.2-0.3 μm, and nickel having a thickness of 0.25-0.35 μm.

Preferably, the adhesive is selected to be an epoxy thermosetting conductive adhesive, an acrylic thermosetting conductive adhesive, or a polyurethane thermosetting conductive adhesive commonly used in the market.

The present application provides a shielding film having a multi-layered metal structure, which comprises an insulating layer and multiple layers of metal composited on the insulating layer; the thickness of each layer of the multiple layers of metal is 0.05-5 μm, the number of layers of the multiple layers of metal is 2-10, and a conductive adhesive layer is provided between the multiple layers of metal. According to the present application, the shielding film has better flexibility and excellent shielding effect by providing multiple layers of metal, controlling the thickness of each layer of the multiple layers of metal, and bonding the multiple layers of metal through the conductive adhesive layer. In addition, by employing the conductive adhesive layer, a bonding force between the metal layers is enhanced, resulting in good high-temperature resistance, thus the bonding force between the metal layers is kept stable and reliable without being decreased under impacts of high temperature. The experimental results show that: when the shielding film has the thickness of 20-35 μm and is provided with 2-7 layers of metal, effectiveness of greater than 80 db can be reached at 10 GHz and effectiveness greater than 70 db can be reached at 100 GHz in the shielding tests; a whole body, formed by press fitting the shielding film onto the flexible board, could pass the high-temperature resistance test of 30 s immersion at 288° C. and could realize more than 50 times bending in the bending resistance test with 135 degrees and Radius 0.38 mm under GB/T2679.5, which all meet basic requirements of the flexible board.

BRIEF DESCRIPTION OF THE DRAWINGS

In order to better illustrate the technical solutions of embodiments in the present application or the prior arts, the drawings used for description of the embodiments or prior arts will be briefly described hereinafter.

FIG. 1 is a schematic view showing the structure of a shielding film having a multi-layered metal structure according to the present application.

DETAILED DESCRIPTION OF THE EMBODIMENTS

The present application provides a shielding film having a multi-layered metal structure, which includes an insulating layer and multiple layers of metal composited on the insulating layer; a thickness of each layer of the multiple layers of metal is 0.05-5 μm, and the number of layers of the multi-layers metal is 2-10; and a conductive adhesive layer is provided between the multiple layers of metal.

According to the present application, multiple layers of metal are provided, the thickness of each layer of metal is controlled, and the multiple layers of metal are bonded through the conductive adhesive layer, which makes the shielding film have better flexibility and excellent shielding effectiveness. In addition, the conductive adhesive layer is employed, which makes a bonding force between the metal layers be enhanced, and makes the shielding film have good flexibility to meet the requirements of flexible circuit boards on the premise of ensuring the shielding performance of high-frequency signals greater than 80 db@10 GHz; a good high-temperature resistance is also provided, and thus the bonding force between the metal layers is kept stable and reliable without being decreased under impacts of high temperature. In the present application, in the situation that basic requirements (flexibility, high-temperature resistance) of the flexible board material is satisfied, the metal is not required to have a great thickness to achieve a shielding performance of greater than 80 db (10 GHz), which is equivalent to a shielding performance of a pure metal layer with the thickness greater than 2 μm, and thus the cost could be reduced.

Referring to FIG. 1, FIG. 1 is a schematic view showing the structure of the shielding film having the multi-layered metal structure according to the present application, wherein 1 represents an insulating layer, 2 represents a first layer of metal, 3 represents a conductive adhesive layer, 4 represents a second layer of metal, 5 represents a last layer of metal, 6 represents a grounding conductive adhesive layer, and 7 represents a protective film.

The shielding film having the multi-layered metal structure according to the present application includes the insulating layer 1, and a thickness of the insulating layer is preferably 2-20 μm. The insulating layer preferably includes resin, an additive, filler and a pigment with a mass ratio of 70-80:5-10:0-12:0-15, where the filler and the pigment may be added as appropriate according to the actual situation. The insulating layer preferably includes the resin, the additive, the filler and the pigment with a mass ratio of 70-80: 5-10:8-12:5-15. The resin is preferably selected to be one or more of polyurethane, epoxy, polyimide, modified silica gel and polyethylene terephthalate. In a specific embodiment, the resin in the insulating layer is Renz® 891, ZY-3600R or Petpur adhesive. The additive in the insulating layer is selected to be one or more of a curing agent, a dispersant agent and a modifying agent which are corresponding to the resin; and the filler is selected to be one or more of titanium dioxide, thermally conductive powder, silica and carbon powder. In a specific embodiment, the filler is selected to be titanium dioxide.

In the present application, the pigment in the insulating layer may allow the insulating layer to be transparent, white or black, which can be selected according to requirements of the customer.

In one embodiment of the present application, the insulating layer specifically includes Renz® 891, titanium dioxide, the additive and black paste with a mass ratio of 70:20:5:5; or, the insulating layer specifically includes ZY-3600R, Taisheng general oily black paste, titanium dioxide and a curing agent for ZY-3600R with a mass ratio of 70:10:10:10; or, the insulating layer specifically includes Petpur adhesive, titanium dioxide, a curing agent for Petpur and Taisheng general oily black paste with a mass ratio of 70:10:10:10.

Specifically, the thickness of the insulating layer may be 3 μm, 5 μm, or 7 nm.

The shielding film having the multi-layered metal structure according to the present application includes multiple layers of metal composited on the insulating layer; the thickness of each layer of the multiple layers of metal is 0.05-5 μm; and the number of layers of the multiple layers of metal is 2-10. The thickness of each layer of the multiple layers of metal is preferably 0.05-2 μm. The number of layers of the multiple layers of metal is specifically 2, 3, 4, 5, 6, 7, 8, 9 or 10. In a specific embodiment, each layer of metal is independently selected to be nickel, gold, silver, copper, aluminum, or tin. The multiple layers of metal include a first layer of metal 2, a second layer of metal 4, up to a last layer of metal 5.

In the present application, a conductive adhesive layer 3 is provided between the multiple layers of metal, and the conductive adhesive layer performs the function of conduction. As a non-metal layer, the conductive adhesive layer can effectively improve flexibility. The conductive adhesive layer includes an adhesive, metal powder, a curing agent and an additive with a mass ratio of 50-80:5-70:5-10: 5-10. The adhesive in the conductive adhesive layer is preferably selected to be one or more of epoxy adhesive, acrylic adhesive, polyester and silica gel; the metal powder is preferably selected to be one or more of nickel powder, silver and copper powder, copper powder, gold powder, silver powder and aluminum powder; the curing agent in the conductive adhesive layer is preferably selected to be one or more of curing agents corresponding to the resin system; the additive in the conductive adhesive layer is selected to be one or more of a curing agent, a filler dispersant agent and a surface active agent corresponding to the resin; the additive in the conductive adhesive layer is added as appropriate according to the actual situation. In the present application, the adhesive in the conductive adhesive layer is selected from conductive adhesives commonly used in the market, such as an epoxy thermosetting conductive adhesive, an acrylic thermosetting conductive adhesive, and a polyurethane thermosetting conductive adhesive. The thickness of the conductive adhesive layer is preferably 1-10 μm, more preferably 3-8 μm. In a specific embodiment, the thickness of the conductive adhesive layer may be 8 μm, 5 μm or 3 μm.

In the present application, the multiple layers of metal are preferably: silver having a thickness of 0.25-0.35 μm and nickel having a thickness of 0.25-0.35 μm; or, copper having a thickness of 0.45-0.55 μm, silver having a thickness of 0.2-0.25 µm, copper having a thickness of 0.95-1.05 µm, nickel having a thickness of 0.2-0.3 µm, and silver having a thickness of 0.2-0.3 µm; or, copper having a thickness of 0.95-1.05 µm, copper having a thickness of 0.45-0.55 µm, silver having a thickness of 0.2-0.3 µm, and nickel having a thickness of 0.25-0.35 µm. In a specific embodiment, the multi-layers metal are: silver having a thickness of 0.3 µm and nickel having a thickness of 0.3 µm; or, copper having a thickness of 0.5 nm, silver having a thickness of 0.2 nm, copper having a thickness of 1 µm, nickel having a thickness of 0.2 µm, and silver having a thickness of 0.2 µm; or, copper having a thickness of 1 µm, copper having a thickness of 0.5 µm, silver having a thickness of 0.2 µm, and nickel having a thickness of 0.3 µm.

In the present application, a top layer of the multiple layers of metal is preferably composited with the grounding conductive adhesive layer 6, and then is covered by the protective film 7. The protective film is preferably selected from a PP protective film and a PET release film.

The various performances of the shielding film according to the present application meet IPC standard, and the effectiveness of greater than 65 db is realized in the shielding test.

The shielding film having the multi-layered metal structure of the present application is preferably obtained according to the following method.

Coating the insulating layer on the release film, performing drying and then arranging the first layer of metal, coating the conductive adhesive layer on the first layer of metal, then repeat arranging the metal layer and coating the conductive adhesive layer, and then arranging the grounding conductive adhesive layer 6 on the last layer of metal, and finally covering with the protective film 7, so that the shielding film having the multi-layered metal structure is obtained.

In the present application, a temperature for drying is preferably 100 to 200° C. The manner of arranging the metal layer is thermally attaching, vacuum plating or water plating. The protective film is selected from PP film or PET release film.

The shielding performance of the shielding film in the present application is tested under GB/T30142-2013.

The bending resistance of the shielding film after being composited with the flexible circuit board is tested under GB/T2679.5, (135 degrees, Radius 0.38 mm).

The high-temperature resistance of the shielding film after being composited with the flexible board is tested under the condition of 30 s immersion at 288° C.

The test results show that: the shielding film according to the present application has good SMT high-temperature tin soldering resistance and bending resistance after being attached to the flexible board; and the bonding force between the layers of metal is good.

For further illustrating the present application, the shielding film having multi-layered metal structure according to the present application will be described below in detail in conjunction with the embodiments, which should not be understood as limiting the protection scope of the present application.

First Embodiment

1) Formula for a polyurethane insulating layer (based on 100 weight parts):
Renz® 891 (Guangdong Pustar Adhesives & Sealants Co. Ltd): 70
Titanium dioxide: 20
Additive (Renz® 891 curing agent): 5
Paste: black: 5

Mixing Renz® 891, titanium dioxide, the additive, and the black paste to obtain black ink;

2) applying the black adhesive on a raw film: unwinding the prepared release film along a coating line to make it pass through a coating head, evenly applying a layer of the black adhesive having a thickness of 3 µm, then surface-drying a butanone solvent in the oven with the temperature of 100° C.-200° C., and performing winding;

3) vacuum plating a silver layer having a thickness of 0.3 µm;

4) applying a conductive adhesive layer having a thickness of 3 µm, where the conductive adhesive layer includes epoxy adhesive, nickel powder, a polyurethane curing agent and an additive with a mass ratio of 70:10:10:10; and performing drying for curing;

5) plating a second layer of metal, which is nickel having a thickness of 0.3 µm, on the adhesive surface;

6) coating the grounding conductive adhesive layer having a thickness of 10 µm on the second layer of metal, and then covering it with a PP protective film; and 8) then performing testing and cutting, to obtain the shielding film having the multi-layered metal structure.

Second Embodiment

1) Formula for an epoxy insulating layer (based on 100 weight parts):
ZY-3600R (Zhongshan Zhuyi Electronic Material Co., Ltd.): 70;
Taisheng general oily black paste (Dongguan Taisheng Pigment Co., Ltd.): 10;
Titanium dioxide: 10;
ZY-3600R curing agent: 10;
Mixing ZY-3600R, Taisheng general oily black paste, titanium dioxide and the curing agent to obtain a black adhesive;
unwinding the prepared release film along the coating line and make it pass through the coating head, evenly applying a layer of black adhesive having a thickness of 5 µm, then surface-drying the solvent in the oven with the temperature of 100° C.-200° C., and performing winding;

3) vacuum plating copper having a thickness of 0.5 µm;

4) applying a conductive adhesive layer having a thickness of 5 µm, where the conductive adhesive layer includes epoxy adhesive, nickel powder, a polyurethane curing agent and an additive with a mass ratio of 70:10:10:10; and performing drying for curing;

5) plating a second layer of metal, which is silver having a thickness of 0.2 µm, on the adhesive surface;

6) repeating steps 4) and 5), to successively plate a third layer of metal which is copper having a thickness of 1 µm, a fourth layer of metal which is Ni having a thickness of 0.2 µm, and a fifth layer of metal which is silver having a thickness of 0.2 µm;

7) coating a grounding conductive adhesive layer on the fifth layer of metal, and covering it with a PET release film; and 8) then performing testing and cutting to the product, to obtain the shielding film having the multi-layered metal structure.

Third Embodiment

1) Adjusted formula for an acrylic ink insulating layer (based on 100 weight parts):
Petpur adhesive (Chongqing Lvchuan): 70
Titanium dioxide: 10

Petpur curing agent: 10;
Taisheng general oily black paste (Dongguan Taisheng Pigment Co., Ltd.): 10;
Mixing the Petpur adhesive, titanium dioxide, the Petpur adhesive curing agent and the black paste to obtain a black adhesive;

2) applying the black adhesive on a raw film: unwinding the prepared release film along the coating line and make it pass through the coating head, evenly applying a layer of black adhesive having a thickness of 7 μm, then surface-drying the solvent in the oven under the temperature of 100° C.-200° C., and performing winding;

3) vacuum plating a layer of copper having a thickness of 1 μm;

4) applying a conductive adhesive layer having a thickness of 8 μm, where the conductive adhesive layer includes an epoxy adhesive, nickel powder, a polyurethane curing agent and an additive with a mass ratio of 70:10:10:10; and performing drying for curing;

5) coating a second layer of metal, which is copper having a thickness of 0.5 μm, on the adhesive surface;

6) repeating steps 4) and 5), to coat a third layer of metal which is silver having a thickness of 0.2 μm, and then coat a fourth layer of metal which is nickel having a thickness of 0.3 μm;

2) applying the black adhesive on a raw film: unwinding the prepared release film along the coating line and make it pass through the coating head, evenly applying a layer of black adhesive having a thickness of 3 μm, and surface-drying the solvent in the oven with the temperature of 100° C.-200° C., and performing winding;

3) attaching a copper foil having a thickness of 2 μm with a thermal attaching machine under the condition of 120° C., and coating a grounding conductive adhesive layer having a thickness of 10 μm on the surface of the copper foil, and then covering with a layer of PP protective film; and 4) then performing testing and cutting, to obtain a shielding film having a single-layered metal structure.

In the present application, the performance tests are conducted to the shielding films prepared according to the first to third embodiments and the first comparative example, respectively. The results are shown in Table 1. Table 1 shows the results of the performance tests to the shielding films prepared according to the first to third embodiments and the first comparative example:

TABLE 1 the results of the performance tests to the shielding films prepared according to the first to third embodiments and the first comparative example

| | Thickness (μm) | shielding performance (10 GHz, db) | shielding performance (100 GHz, db) | high-temperature resistance (composited to ordinary double-sided flexible board): 30 s immersion at 288° C. | bending resistance (composited to ordinary double-sided flexible board): GB/T2679.5, 135 degrees, Radius 0.38 mm | bonding force between metal layer and adhesive layer 180 degrees at the rate of 57 mm/min |
|---|---|---|---|---|---|---|
| First Embodiment | 20 | 78 | 71 | Pass | >50 times | >5 N/cm |
| Second Embodiment | 35 | 85 | 79 | Pass | >50 times | >5 N/cm |
| Third Embodiment | 25 | 83 | 71 | Pass | >50 times | >5 N/cm |
| First Comparative Example | 22 | 81 | 67 | Pass | <20 times | >5 N/cm |

7) coating a grounding conductive adhesive layer on the fourth layer of metal, and covering it with a PP protective film; and 8) then performing testing and cutting to the product, to obtain the shielding film having the multi-layered metal structure.

First Comparative Example

1) Formula for a polyurethane insulation layer (based on 100 weight parts):
Renz®891 (Guangdong Pustar Adhesives & Sealants Co. Ltd): 70
Titanium dioxide: 20
Additive (Renz®891 curing agent): 5
Paste: black: 5
Mixing Renz® 891, titanium dioxide, the additive, and the black paste to obtain a black adhesive;

As can be seen from the above embodiments, the present application provides an insulating layer and multiple layers of metal composited on the insulating layer, the thickness of each of the multiple layers of metal is 0.05-5 μm; the number of the multiple layers is 2-10; and a conductive adhesive layer is arranged between the multiple layers of metal. In the present application, the shielding film has better flexibility and excellent shielding effect by providing multiple layers of metal, controlling the thickness of each layer of the multiple layers of metal, and bonding the multiple layers of metal through the conductive adhesive layer. In addition, by employing the conductive adhesive layer, the bonding force between the metal layers is enhanced, resulting in good high-temperature resistance, thus the bonding force between the metal layers is kept stable and reliable without being decreased under impacts of high temperature. The experimental results show that: when the shielding film has the thickness of 20-35 μm is provided with 2-7 layers of metal, the effectiveness of 78-85 db at 10 GHz and 71-79 db at 100

GHz are realized in the shielding tests; a whole body, formed by press fitting the shielding film onto the flexible board could pass the high-temperature resistance test of 30 s immersion at 288° C. and could realize more than 50 times bending in the bending resistance test with 135 degrees and Radius 0.38 mm under GB/T2679.5, which all meet the basic requirements of the flexible board.

The above embodiments are only preferred embodiments of the present application. It should be noted that, for those skilled in the art, other improvements and modifications may be further made without departing from the principle of the present application, and these improvements and modifications should also be deemed as falling into the protection scope of the present application.

The invention claimed is:

1. A shielding film having a multi-layered metal structure, comprising an insulating layer and multiple layers of metal composited on the insulating layer; wherein
    a thickness of each layer of the multiple layers of metal is 0.05-5 μm and the number of layers of the multiple layers of metal is 2-10;
    a conductive adhesive layer is provided between the multiple layers of metal; and
    the insulating layer comprises resin, an additive, a filler and a pigment with a mass ratio of 70-80:5-10:0-12:0-15; and wherein
    the resin is selected to be one or more of polyurethane, epoxy, polyimide, modified silica gel and polyethylene terephthalate;
    the additive is selected to be one or more of a curing agent, a dispersant agent and a modifying agent corresponding to the resin; and
    the filler is selected to be one or more of titanium dioxide, thermally conductive powder, silica and carbon powder.

2. The shielding film according to claim 1, wherein a thickness of the insulating layer is 2 μm-20 μm.

3. The shielding film according to claim 1, wherein a thickness of the conductive adhesive layer is 1 μm-10 μm.

4. The shielding film according to claim 1, wherein each layer of the multiple layers of metal is independently selected to be nickel, gold, silver, copper, aluminum, or tin.

5. The shielding film according to claim 1, wherein the conductive adhesive layer comprises an adhesive, metal powder, a curing agent and an additive with a mass ratio of 50-80:5-70:5-10:5-10.

6. The shielding film according to claim 5, wherein the adhesive is selected to be an epoxy thermosetting conductive adhesive, an acrylic thermosetting conductive adhesive, or a polyurethane thermosetting conductive adhesive commonly used in the market.

7. The shielding film according to claim 1, wherein a thickness of the shielding film is 10 μm-50 μm.

8. The shielding film according to claim 1, wherein the multiple layers of metal are listed in sequence as follows:
    silver having a thickness of 0.25-0.35 μm and nickel having a thickness of 0.25-0.35 μm; or,
    copper having a thickness of 0.45-0.55 μm, silver having a thickness of 0.2-0.25 μm, copper having a thickness of 0.95-1.05 μm, nickel having a thickness of 0.2-0.3 μm, and silver having a thickness of 0.2-0.3 μm; or,
    copper having a thickness of 0.95-1.05 μm, copper having a thickness of 0.45-0.55 μm, silver having a thickness of 0.2-0.3 μm, and nickel having a thickness of 0.25-0.35 μm.

* * * * *